(12) United States Patent
Kinget et al.

(10) Patent No.: US 7,847,667 B2
(45) Date of Patent: Dec. 7, 2010

(54) SYSTEMS AND METHODS FOR REDUCING CIRCUIT AREA

(75) Inventors: Peter R. Kinget, Summit, NJ (US); Frank Zhang, Edison, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 11/943,287

(22) Filed: Nov. 20, 2007

(65) Prior Publication Data

US 2008/0180187 A1 Jul. 31, 2008

Related U.S. Application Data

(63) Continuation of application No. PCT/US2006/020155, filed on May 24, 2006.

(60) Provisional application No. 60/684,496, filed on May 24, 2005.

(51) Int. Cl.
*H01F 5/00* (2006.01)
(52) U.S. Cl. ....................................... 336/200
(58) Field of Classification Search ............ 336/65, 336/200, 232; 331/2, 117 R, 117 FE, 117 D; 257/531
See application file for complete search history.

(56) References Cited

U.S. PATENT DOCUMENTS

| | | | |
|---|---|---|---|
| 6,072,205 A | 6/2000 | Yamaguchi et al. | |
| 6,437,653 B1 | 8/2002 | Cruz et al. | |
| 6,486,529 B2 | 11/2002 | Chi et al. | |
| 6,775,901 B1 | 8/2004 | Lee et al. | |
| 6,825,749 B1 | 11/2004 | Lin et al. | |
| 6,856,225 B1 | 3/2005 | Chua et al. | |
| 6,870,457 B2 | 3/2005 | Chen et al. | |
| 6,885,275 B1 | 4/2005 | Chang | |
| 6,940,355 B2 * | 9/2005 | Hajimiri et al. | 331/2 |

(Continued)

FOREIGN PATENT DOCUMENTS

TW 499828 B 8/2002

(Continued)

OTHER PUBLICATIONS

International Search Report and Written Opinion for International Patent Application No. PCT/US2006/020155.

(Continued)

*Primary Examiner*—Tuyen Nguyen
(74) *Attorney, Agent, or Firm*—Byrne Poh L.L.P.

(57) ABSTRACT

Methods and systems are provided for reducing circuit area. Some embodiments provide electronic devices including an inductor formed from a path having two ends that loops substantially in a plane around a center area, wherein the path crosses itself at least two points and wherein the path defines an outer boundary of the inductor; and a circuit that is located within the outer boundary of the inductor and substantially within or adjacent to the plane. Other embodiments provide electronic devices including an inductor formed from a path having two ends that loops substantially in a plane around a center area, wherein the path defines an outer boundary of the inductor; and a circuit that is located within the outer boundary of the inductor and substantially within or adjacent to the plane, and wherein the circuit comprises a signal path that is rake-shaped and crosses the path of the inductor at substantially perpendicular angles.

10 Claims, 11 Drawing Sheets

U.S. PATENT DOCUMENTS

| | | | |
|---|---|---|---|
| 7,088,195 B2* | 8/2006 | Muramatsu et al. | 331/117 R |
| 2003/0202331 A1 | 10/2003 | Jessie et al. | |
| 2003/0222732 A1* | 12/2003 | Matthaei | 333/99 S |
| 2008/0180187 A1 | 7/2008 | Kinget et al. | |

OTHER PUBLICATIONS

R. Ahola et al., "A single-chip CMOS transceiver for 802.11a/b/g wireless LANs," *IEEE J. Solid-State Circuits*, vol. 39, No. 12, pp. 2250-2258, Dec. 2004.

C.-L. Chen, "Effects of CMOS process fill patterns on spiral inductors," *Microw. Opt. Technol. Lett.*, vol. 36, pp. 462-465, 2003.

C. Detcheverry, "The effect of copper design rules on inductor performance," in *Proc. Eur. Solid-State Device Research Conf.*, Sep. 2003, pp. 107-110.

E. Hegazi, H. Sjoland, and A. A. Abidi, "A filtering technique to lower LC oscillator phase noise," *IEEE J. Solid-State Circuits*, vol. 36, No. 12, pp. 1921-1930, Dec. 2001.

S. Kapur and D. E. Long, "Large-scale full-wave simulation," in *Proc. Design Automation Conf.*, Jun. 2004, pp. 806-809.

P. Kinget, "Integrated GHz voltage controlled oscillators," in *Analog Circuit Design: (X)DSL and Other Communication Systems; RF MOST Models; Integrated Filters and Oscillators*, W. Sansen, J. Huijsing, and R. van de Plassche, Eds. Boston, MA: Kluwer, 1999, pp. 353-381.

W. B. Kuhn et al., "Spiral inductor performance in deep-submicron bulk-CMOS with copper interconnects," in *IEEE MTT-S Int. Microwave Symp. Dig.*, Jun. 2002, vol. 1, pp. 301-304.

Cover photograph of: T. H. Lee, The Design of CMOS Radio-Frequency Integrated Circuits, 1st ed. Cambridge, U.K.: Cambridge Univ. Press, 1998.

R. G. Meyer, "Low-power monolithic RF peak detector analysis," *IEEE J. Solid-State Circuits*, vol. 30, No. 1, pp. 65-67, Jan. 1995.

Y. Papananos and N. Nastos, "Inductor over MOSFET: Operation and theoretical study of a CMOS RF three-dimensional structure," in *Proc. 24th Int. Conf. Microelectronics*, May 2004, pp. 525-529.

C. P. Yue and S. S. Wong, "On-chip spiral inductors with patterned ground shields for Si-based RF ICs," *IEEE J. Solid-State Circuits*, vol. 33, No. 5, pp. 743-752, May 1998.

F. Zhang, C.-F. Chu, and P. Kinget, "Voltage-controlled oscillator in the coil," in *Proc. IEEE Custom Integrated Circuits Conf.*, Sep. 2005, pp. 587-590.

F. Zhang and P. Kinget, "Design of Components and Circuits Underneath Integrated Inductors," *IEEE Journal of Solid-State Circuits*, Oct. 2006, pp. 2265-2271.

F. Zhang, Chen-Feng Chu and P. Kinget, "Voltage-controlled oscillator in the coil," Slides presented at the IEEE Custom Integrated Circuits Conference (CICC), Oct. 2005.

International Search Report and Written Opinion issued for corresponding International Application No. PCT/US2006/020155.

Da Dalt, Nicola, et al., "A 10b 10GHz Digitally Controlled LC Oscillator in 65 nm CMOS," Digest of Technical Papers International Solid-State Circuits Conference, pp. 669-678, Feb. 2006.

Josse, E., et al., "A Cost-Effective Low Power Platform for the 45-nm Technology Node," International Electron Devices Meeting (IEDM), pp. 1-4, Dec. 11-13, 2006.

Kinget, P., B. Soltanian, S. Xu, S. Yu and F. Zhang, "Advanced Design Techniques for Integrated Voltage Controlled LC Oscillators," IEEE Custom Integrated Circuits Conference, pp. 805-811, Sep. 2007.

Rylyakov, A.V., et al., "A Wide Power-Supply Range (0.5V-to-1.3V) Wide Tuning Range (500 MHz-to-8 GHz) All-Static CMOS AD PLL in 65nm SOI," Digest of Technial Papers International Solid-State Circuits Conference, pp. 172-173, Feb. 2007.

Staszewski, R., et al., "All-digital PLL and GSM/EDGE transmitter in 90nm CMOS," Digest of Technical Papers IEEEE International Solid-State Circuits Conference (ISSCC), pp. 316-317, Feb. 2005.

Suehle, J.S., "Ultrathin Gate Oxide Reliability: Physical Models, Statistics, and Characterization," IEEE Transactions on Electron Devices, vol. 49, No. 6, pp. 985-971, Jun. 2002.

Yu, S.A. and P. Kinget, "A 0.65V 2.5GHz Fractional-N Frequency Synthesizer in 90nm CMOS" in Digest of Technical Papers IEEE International Solid-State Circuits Conference (ISSCC), pp. 304-305, Feb. 2007.

Yu, S.A. and P. Kinget, "A 0.042-mm2 Fully Integrated Analog PLL with Stacked Capacitor-Inductor in 45nm CMOS," European Solid-State Circuits Conference, pp. 94-97, Sep. 2008.

Balankutty et al., "A 0.6V 32.5mW Highly Integrated Receiver for 2.4 GHz ISM-Band Applications," 2008 IEEE International Solid-State Circuits Conference, pp. 366, 367, and 620, 2008.

Yu et al., "A 0.65V 2.5GHz Fractional-N Frequency Synthesizer in 90nm CMOS," 2007 IEEE International Solid-State Conference, pp. 304, 350, and 604, 2007.

Kossel et al., "A Low-Jitter Wideband Multiphase PLL in 90nm SOI CMOS Technology," 2005 International Solid-State Circuits Conference, pp. 414 and 415, 2005.

Gebara et al., "A 1V 18GHz Clock Generator in a 65nm PD-SOI Technology," 2007 IEEE International Solid-state Conference, pp. 312 and 313, 2007.

Desai et al., "A Dual-Supply 0.2-to-4GHz PLL Clock Multiplier in a 65nm Dual-Oxide CMOS Process," 2007 IEEE International Solid-State Conference, pp. 308, 309, and 604, 2007.

Weltin-Wu et al., "A 3GHz Fractional-N All-Digital PLL with Precise Time-to-Digital Converter Calibration and Mismatch Correction," 2008 IEEE International Solid-State Conference, pp. 344, 345, and 618, 2008.

Borremans, "A 400uW 4.7-to-6.4GHz VCO under an Above-IC Inductor in 45nm CMOS," 2008 IEEE International Solid-State Conference, pp. 536, 537, and 634, 2008.

Long et al., "The Modeling, Characterization, and Design of Monolithic Inductors for Silicon RF IC's," IEEE Journal of Solid-State Circuits, vol. 32, No. 3, Mar. 1987.

U.S. Appl. No. 12/491,608, filed Jun. 25, 2009, in which prosecution is on-going.

U.S. Appl. No. 60/684,496, filed May 24, 2005.

U.S. Appl. No. 61/075,403, filed Jun. 25, 2008.

* cited by examiner

US 7,847,667 B2

SYSTEMS AND METHODS FOR REDUCING CIRCUIT AREA

CROSS-REFERENCE TO RELATED APPLICATION

This application is a continuation of International Patent Application No. PCT/US2006/020155, filed May 24, 2006, which claims the benefit under 35 U.S.C. §119(e) of U.S. Provisional Patent Application No. 60/684,496 filed May 24, 2005, each of which is hereby incorporated by reference herein in its entirety.

TECHNICAL FIELD

The disclosed subject matter relates to the field of integrated circuit design. More particularly, some embodiments of the disclosed subject matter relate to systems and methods for reducing circuit area.

BACKGROUND

An inductor is an electronic device used in circuits for its property of inductance. The behavior of inductors is related to phenomena associated with magnetic fields. When electric current flows through an inductor, magnetic fields may be created. Moreover, if the current varies with time, then the magnetic field will vary with time. This time-varying magnetic field induces a voltage in electrical conductors exposed to it. The circuit parameter of inductance relates the induced voltage to the current.

One property of an inductor is its quality factor, Q. The quality factor of an inductor is proportional to the ratio of its inductance to its resistance at a given frequency, and is a measure of the inductor's efficiency. The higher the quality factor, the more efficient the inductor is. The quality factor of an inductor may be influenced by several factors, one factor being eddy currents, which are the circulating flow of charges caused by a moving magnetic field within a nearby conductive material or device. The flow of eddy currents generates magnetic fields that oppose changes in external magnetic fields. Generation of eddy currents near an inductor degrades the inductor's quality factor, and thus if one is concerned with the quality factor of an inductor, it is usually desirable to avoid having eddy currents in devices near inductors.

On-chip inductors, despite being large, are often made of only two metal layers. A minimum metal density requirement for each metal layer over an entire wafer of an IC may be set to reduce topographical variations, increase uniformity, and target a certain yield. Therefore, it may be desired to increase the metal density count of a layer. Placing metal fills inside or near an inductor increases the metal density count, but has the possible drawback of decreasing the quality factor of the inductor through eddy current loss. Measurement results of inductors with metal fills have been reported before, but none have established a relationship between fill cell size and the inductor quality factor. This relationship is of great interest because it allows one to estimate the largest device that can be placed inside an inductor.

It should be noted that the topmost metal layer in a fabrication process is often referred as the thick top metal. The thick top metal layer is often several times thicker than the other metal layers, and thus has a lower resistance. This is beneficial for making inductors because a lower resistance improves the quality factor of an inductor.

Spiral on-chip inductors are a type of inductor used in the design of, for example, radio frequency integrated circuits (RFICs). These spiral on-chip inductors often occupy more than half of the total chip area in RFICs. The region in and around an on-chip inductor is typically kept clear of active and passive devices to avoid the generation of eddy currents in the devices, which, as discussed, degrades the quality factor of the inductor. However, leaving the area near an inductor empty is a waste of space and increases chip size. This is a problem because reducing the area, and therefore the cost of circuits is a concern in circuit design.

Therefore, it is beneficial to reduce restrictions on the spacing among devices on a circuit. Specifically, it would be of benefit to reduce spacing restrictions between inductors and other devices.

SUMMARY

Methods and systems are provided for reducing circuit area. Some embodiments provide electronic devices including an inductor formed from a path having two ends that loops substantially in a plane around a center area, wherein the path crosses itself at least two points and wherein the path defines an outer boundary of the inductor; and a circuit that is located within the outer boundary of the inductor and substantially within or adjacent to the plane.

Other embodiments provide electronic devices including an inductor formed from a path having two ends that loops substantially in a plane around a center area, wherein the path defines an outer boundary of the inductor; and a circuit that is located within the outer boundary of the inductor and substantially within or adjacent to the plane, and wherein the circuit comprises a signal path that is rake-shaped and crosses the path of the inductor at substantially perpendicular angles.

DETAILED DESCRIPTION

One consideration in the design of integrated circuits is that, by keeping the sizes of devices in close proximity to an inductor small, the induced eddy current loops will be localized in small regions and thus the reduction of the inductor's quality factor will be lessened. A second consideration is that by carefully planning the current paths of devices, the magnetic coupling between the device currents and the inductor currents may be reduced. A further consideration is the relationship between the placement of metal fills in an around an inductor and the inductor's quality factor.

In accordance with some embodiments of the disclosed subject matter, systems and methods for placing passive and active devices inside an inductor are provided. In particular, non-active devices, such as varactors, as well as active devices are placed inside an inductor to create a compact voltage controlled oscillator (VCO) that has equal performance to traditional voltage controlled oscillators while using significantly less area. Some embodiments of the disclosed subject matter may also be applicable to other types of circuits. For example, the capacitors of a phase locked loop filter may be placed under a voltage controlled oscillator inductor. These systems and methods may result in the reduction of layout area and therefore the cost of circuits.

Figure 1:
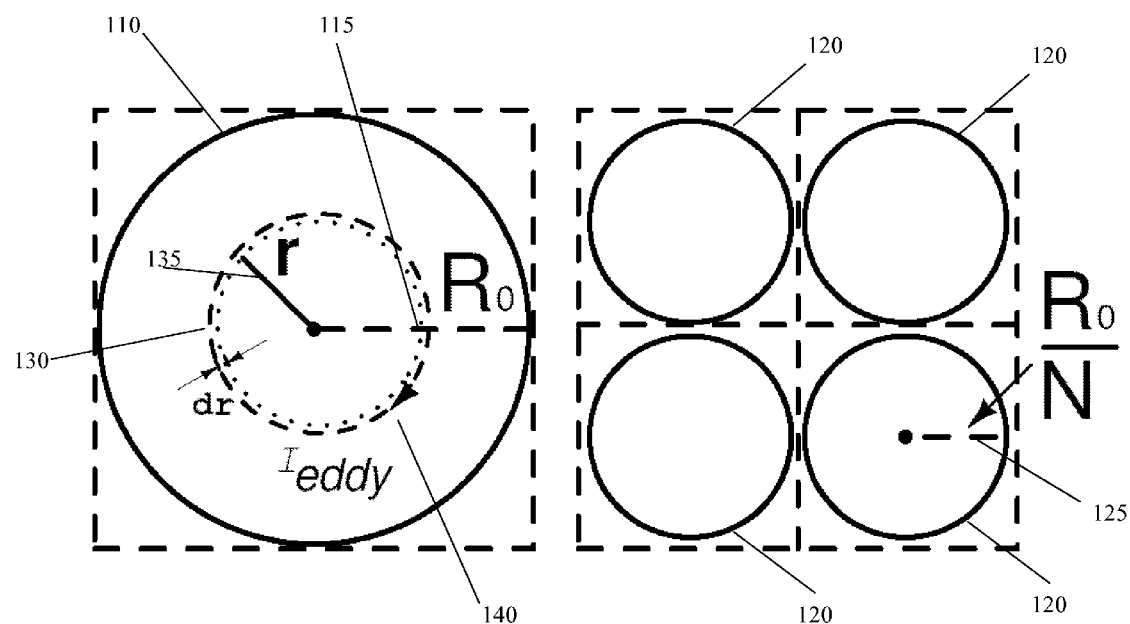
FIG. 1 is an illustration of eddy current in metal fills inside a magnetic field.

FIG. 1 illustrates eddy currents in metal fills inside a magnetic field. In this example, because the effect of metal fill structures with small dimensions is of particular interest, it may be assumed that the skin effect in the metal fill and the effect of the induced currents on the magnetic field can be neglected.

The circular metal fill 110 has a radius $R_0$ 115, and occupies about the same amount of area as $N^2$ smaller circular metal fills 120 with radii $R_0/N$ 125. In this example, N has a value of 2. For mathematical convenience, circular metal fills are used to approximate square metal fills that are used in real layouts. Assuming a small fill cell size compared to the dimensions of the inductor, the magnetic field, B, is uniform over the area of the metal fill cell and is not a function of radius, r 135. Radius, r 135, is the radius that encloses the magnetic flux, (d), in a circular loop, where Φ is given by:

$$\Phi = B \cdot dA = B \cdot (\pi r^2) \quad \text{(I)}$$

Using Faraday's Law, $$V = -\frac{d\Phi}{dt} = \frac{dB}{dt} \cdot \pi r^2 \quad \text{(II)}$$

where V is the potential developed along any current path as a result of changing flux induced by AC current in the inductor. The negative sign indicates that the current, $I_{eddy}$ 140, induced by V, will flow in such a direction as to oppose the flux that produced it. The resistance, R, of a thin cylindrical sheet of metal fill, bounded by the dashed and dotted lines 130 in FIG. 1, is equal to:

$$R = \frac{\rho}{h \cdot dr} \cdot (2\pi r), \quad \text{(III)}$$

where ρ is the resistivity of the fill metal, h is the height of the metal fill, and dr is the incremental thickness of the cylindrical sheet. From equation II and equation III, the total power dissipated in a metal fill with radius, $R_0$, is:

$$P_{diss} = \int \frac{V^2}{R} = \int \left(\frac{dB}{dt}\right)^2 \cdot \frac{\pi \cdot h}{2 \cdot \rho} \cdot r^3 dr. \quad \text{(IV)}$$

Since a large metal fill can be replaced by $N^2$ small metal fills, the power dissipation for the two cases are:

$$P_{diss} = \begin{cases} \left(\frac{dB}{dt}\right)^2 \cdot \frac{\pi \cdot h}{8 \cdot \rho} \cdot R_0^4 & \text{(in one fill with radius } R_0\text{)} \\ \left(\frac{dB}{dt}\right)^2 \cdot \frac{\pi \cdot h}{8 \cdot \rho} \cdot \frac{R_0^4}{N^2} & \text{(in } N^2 \text{ small fills with radii } \frac{R_0}{N}\text{)} \end{cases} \quad \text{(V)}$$

The power dissipated in the metal fills is an additional loss mechanism for the inductor and thus reduces its quality factor. However, equation V shows, the power dissipation is reduced as the fill cell sizes are reduced. Accordingly, in some embodiments of the systems and methods of the disclosed subject matter, electric devices are divided into smaller electric devices to lessen adverse effects on other near-by devices.

Figure 2:
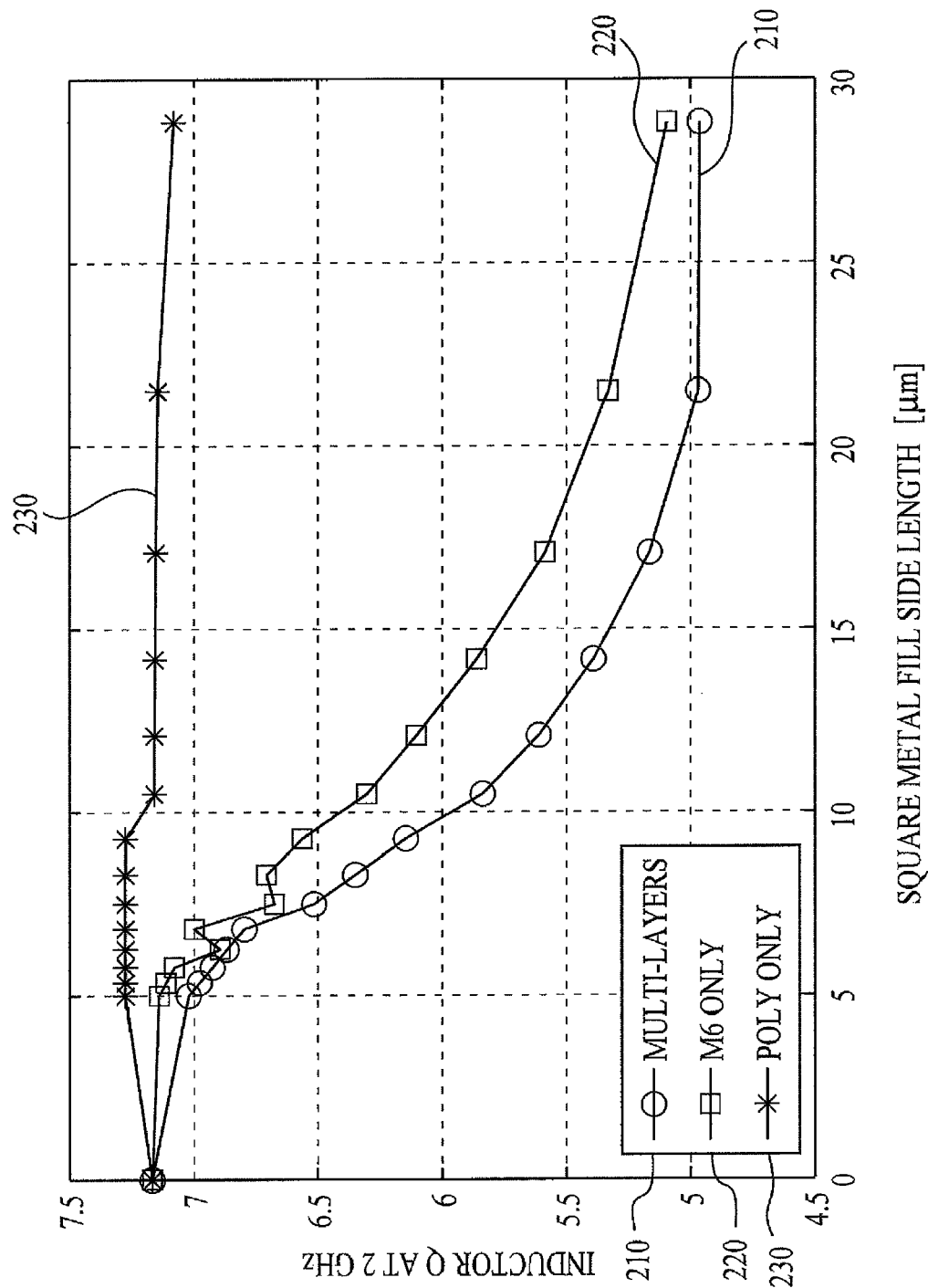
FIG. 2 is a graph illustrating the relationship between inductor qualify factor and metal fill side length in accordance with some embodiments of the disclosed subject matter.

Equation V provides guidelines on device sizing inside an inductor, but is not sufficiently accurate for quantitative estimates. For more accurate estimates, full-wave simulations on inductors with different fill cell sizes may be run using an electromagnetic simulator such as ElectroMagnetic eXtractor (EMX) available from Integrand Software Inc. of Berkeley Heights, N.J. However, any suitable simulator may be used. FIG. 2 illustrates the results from EMX simulations and shows a simulated quality factor at 2 GHz of a five-turn, 4.5 nH differential inductor, $L_{diff}$, for different fill cell sizes and resistivity. Inductor $L_{diff}$ 510 is used in the VCO of FIG. 5, which will be described later. The inductor may be constructed using the thick top metal, and have an outer diameter of 200 μm, inner diameter of 80 μm, trace width of 10 μm, and trace spacing of 3 μm. The metal fills may be placed in the center of the inductor and may be constructed by stacking all the available metal and polysilicon layers without vias in between. FIG. 2 illustrates the inductor quality factor versus square metal fill side length for multi-layer fills 210, metal-only fills 220, and polysilicon-only fills 230. A metal fill side length of zero represents the case were no metal fills are used. The quality factor degrades rapidly as the metal fill dimensions become large, as can been seen only with multi-layer fills 210 and metal-only fills 220. However, for the more resistive polysilicon fills 230, the eddy loss is much less, as predicted by equation V. It should be noted that the term "M6" refers to metal layer number six, and is the thick top metal layer of the fabrication process used in this embodiment. However, the number of metal layers can be altered without departing from the scope of the methods and systems of the present invention. It should also be noted that, in this embodiment, the multi-layer fills include metal layers M1-M6 as well as a polysilicon layer.

Figure 3:
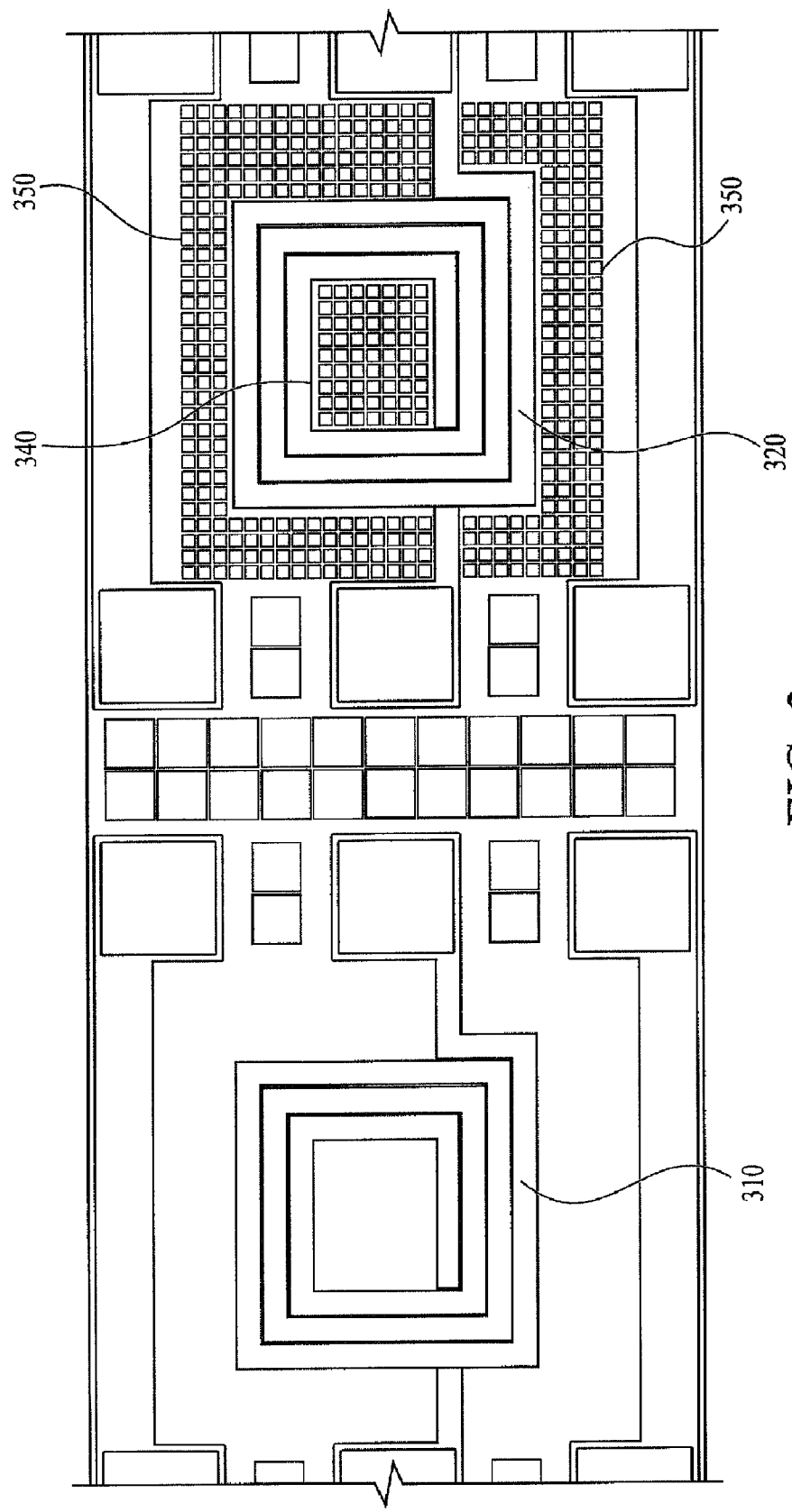
FIG. 3 is a photograph that includes two inductors that may be used in accordance with some embodiments of the disclosed subject matter.

The accuracy of EM simulations may be compared against measurement data from test structures, for example, a 0.25 μm BiCMOS process. A single-ended 2.3 nH inductor may be constructed using the thick top metal layer, with an outer diameter of 200 μm, and inner diameter of 100 μm, a trace width of 10 μm, and a trace spacing of 3 μm. A die photograph of such test structures is shown in FIG. 3. Inductor 310 is without metal fills, while the inductor 320 is with metal fills. In this example, the metal fills are 7 μm by 7 μm squares with spacing of 3 μm, and are of the multi-layer type. The metal fills are placed in area 340, inside the inductor, and area 350, around the inductor.

Figure 4:
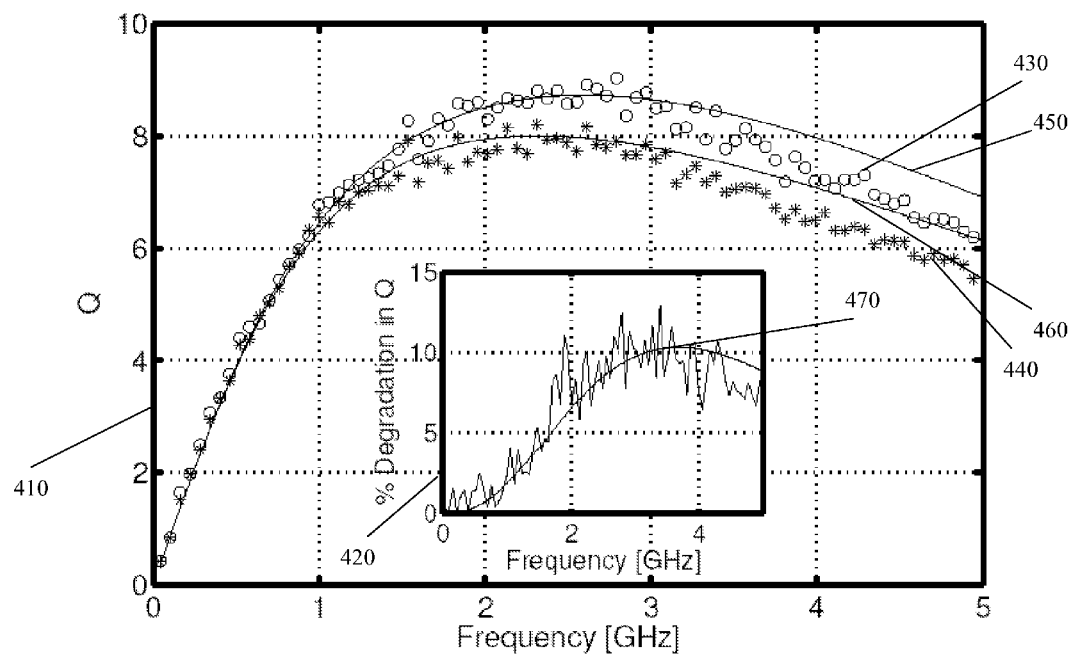
FIG. 4 contains two graphs relating to eddy current loss with respect to the presence of metal fill.

FIG. 4 illustrates quality factor versus frequency, in graph 410, and the percent degradation in quality factor versus frequency, in graph 420. The measured quality factor of plain inductor 310 is shown with the line formed of "o's" 430. The measured quality factor of inductor 320 with metal fills is shown with the line formed of "*'s" 440. Lines 450 and 460 show the corresponding simulation results. An error of less than 5% in quality factor is observed between the simulated data, 450 and 460, and the measured data, 430 and 440, for a frequency below 3 GHz. A maximum quality factor degradation of approximately 10% occurs at its peak as shown in FIG. 4 at reference label 470. In contrast, the typical application range of an inductor in a tunable VCO is below its peak quality factor frequency since the varactors and the parasitics of the active devices add significantly to the tank capacitance.

The phase noise of voltage controlled oscillators (VCOs) is very sensitive to the quality factor of inductors. Because of this, VCOs are useful in demonstrating the systems and methods of the disclosed subject matter. Two identically designed VCOs having differed layouts may be used to demonstrate some of the advantages of placing a device inside an inductor in accordance with some embodiments. Specifically, VCOs may be placed inside an inductor for this purpose. As discussed above, however, placing transistors and varactors near the inductor will decreases the quality factor of the inductor due to the presence of eddy currents. However, by using a tank layout for VCOs in the inductor that places the transistors and varactors under the inductor as described above, significant losses due to eddy currents may be avoided.

Figure 5:
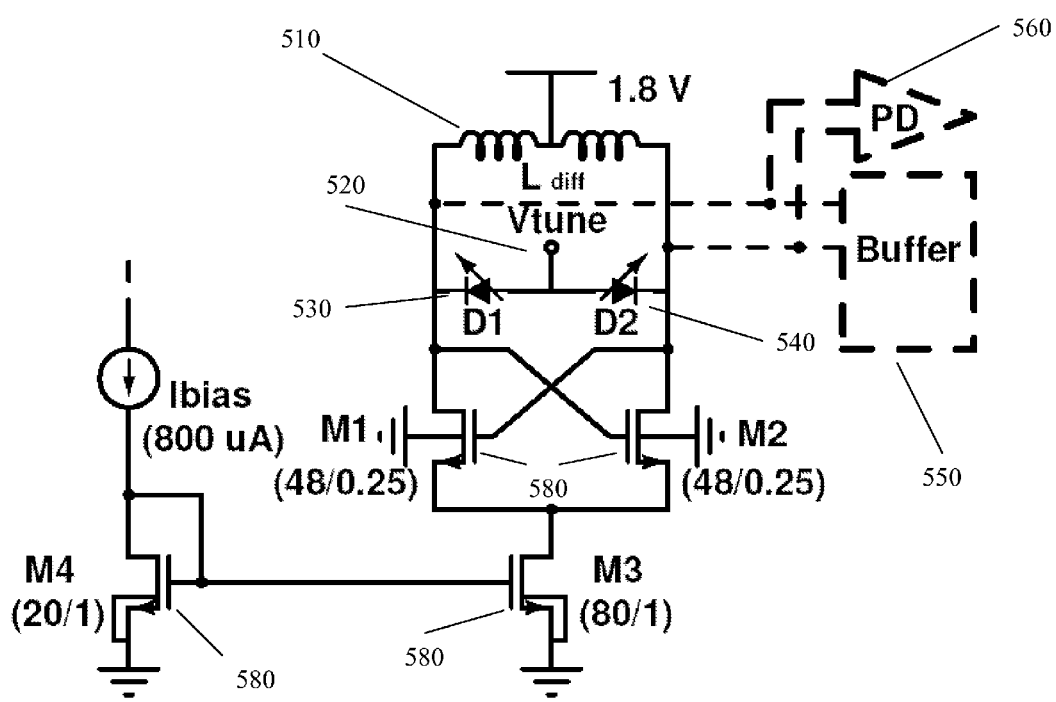
FIG. 5 is a schematic diagram of a voltage controlled oscillator that may be used in accordance with some embodiments of the disclosed subject matter.

Referring to FIG. 5, the layout of an inductor $L_{diff}$ 510 may be modified to allow placement of varactors 530 and 540 inside inductor 510. As show in FIG. 6, by folding the leads of inductor 510 "outside in," the cathodes of the varactors can be connected along the inner-most turn of the inductor. It should be noted that although this connection can result in a distributed effect, which is undesirable in a narrowband circuit, the actual effect on the circuit is small because the inner-most turn only contributes to a small fraction of the total inductance. The varactors 530 and 540 may be connected to the inductor 510 as illustrated in FIG. 5. It should be noted that the plurality of varactors 670 shown in FIG. 6 are collectively shown as varactors 530 and 540 in FIG. 5. It should also be noted that the buffer 550 and the peak detector 560 are auxiliary circuits to facilitate measurements of the circuit.

Figure 6A:
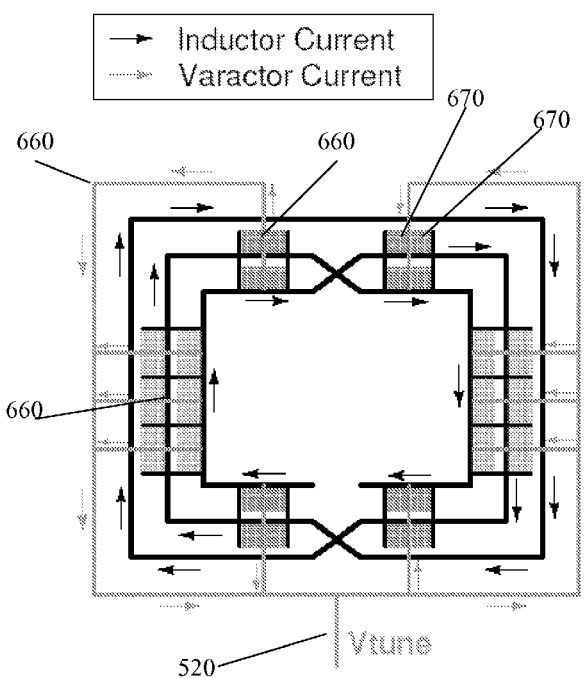
FIG. 6a is a simplified illustration of a layout style for a voltage tuning input of a voltage controlled oscillator and associated current flows in accordance some embodiments of the disclosed subject matter.
Figure 6B:
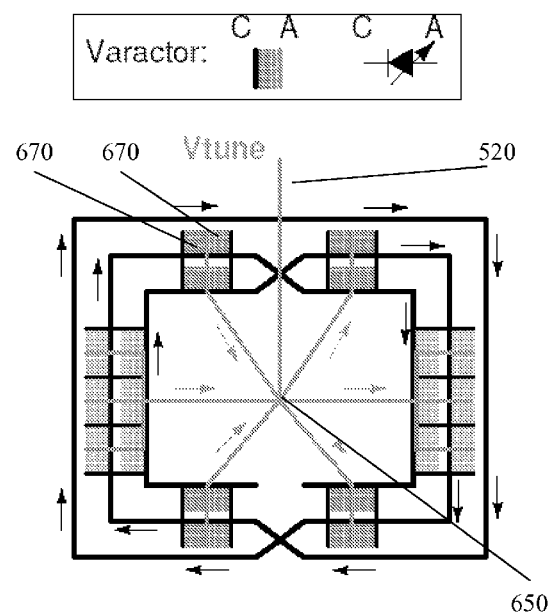
FIG. 6b is a simplified illustration of another layout style for a voltage tuning input of a voltage controlled oscillator and associated current flows in accordance with some embodiments of the disclosed subject matter.

FIGS. 6a and 6b illustrate two layout options for a $V_{tune}$ line 520, that connects the anodes of the varactors 530 and 540 together. In FIG. 6a the anodes of the varactors 530 and 540 are connected together on the outside of the inductor. For example, at reference label 660, the connection of the anodes of multiple varactors 670 is shown. A drawback of this configuration is that the current paths of $V_{tune}$ line 520 are parallel to the flow of the inductor current, causing further unwanted magnetic coupling. The configuration illustrated in FIG. 6b distributes $V_{tune}$ line 520 from the center 650 of the inductor, thus keeping the wires with parallel current flow far apart.

Figure 7B:
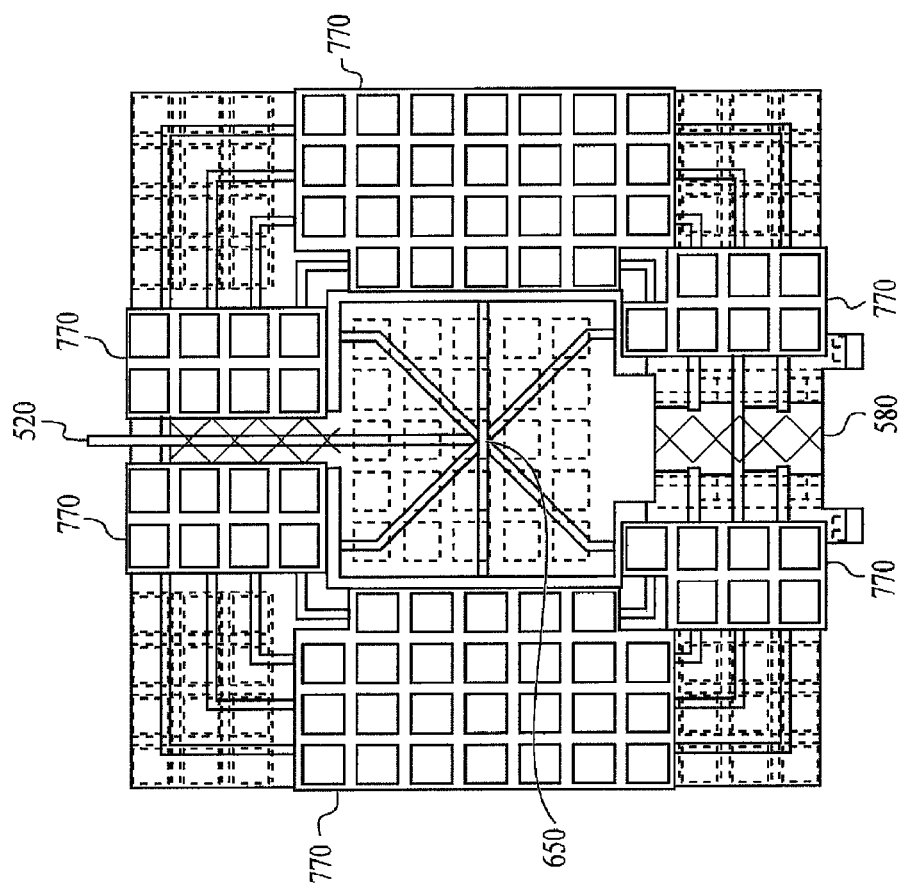
FIG. 7b is a simplified illustration of a layout of a voltage controlled oscillator in accordance with some embodiments of the disclosed subject matter.
Figure 7A:
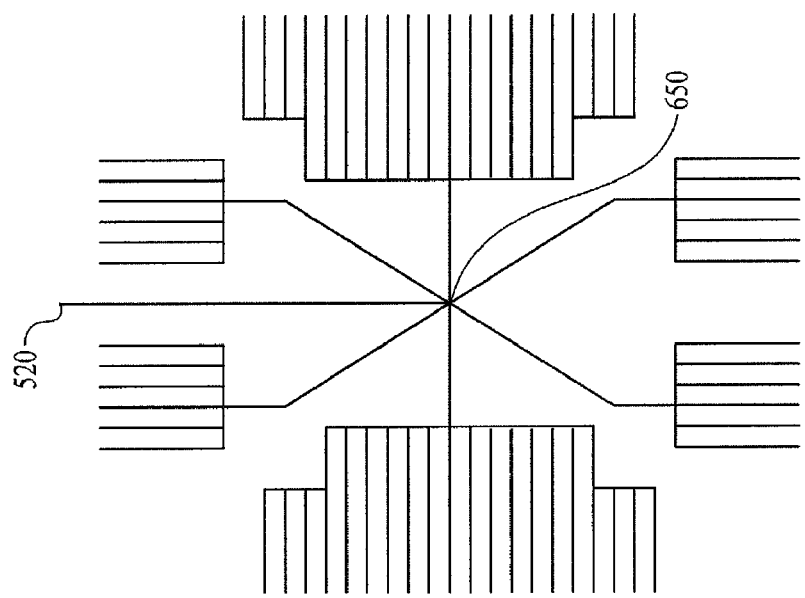
FIG. 7a is a simplified illustration of rake-shaped metal wiring using for a voltage-tuning input in accordance with some embodiments of the disclosed subject matter.

FIG. 7a illustrates the details of rake-shaped metal wiring used to connect the anodes of the varactors 530 and 540. The shape of the wiring is similar to that of a patterned ground shield (PGS). The fingers of the rake-shaped wiring are oriented such that the current flow is perpendicular to the direction of the inductor current, thus reducing magnetic coupling between the two. Furthermore, since the $V_{tune}$ node is a signal ground for differential signals, the rake-shaped wiring acts as a grounded PGS that absorbs stray electric field from the inductor to the substrate, thus improving the quality factor of the inductor.

Another concern in the VCO tank layout is the resistance of $V_{tune}$ line 520, since its series resistance adds thermal noise that is directly upconverted into phase noise. In order to address this, parasitic resistance extraction may be performed on the longest wire path from $V_{tune}$ pin 520 to the varactor anode. In order to lower the wire resistance, multiple metal layers may be strapped together. Lowering the resistance of $V_{tune}$ line 520 worsens its eddy current effect on the inductor, as Equation 5 suggests. However, the rake-shaped wiring in FIG. 7a prevents eddy currents from circulating in large loops and thus reduces their effect.

FIG. 7b illustrates a layout of the VCO. Simulating the differential inductor, $L_{diff}$ 510, by itself using EMX finds a quality factor of approximately 7 at 2 GHz. Small varactors of dimensions 12 μm by 11 μm, collectively shown as D1 530 and D2 540, are connected to the differential inductor. In this case 82 varactor diodes are connected to the inductor, though any appropriate number may be used. The varactor diodes D1 530 and D2 540 may be made from p+ base in the n-well and have a simulated quality factor of about 40 at 2 GHz. It should be noted that the positions and connections of varactors 770 of FIG. 7 substantially correspond to the positions and connections of varactors 670 in FIG. 6B. The location of transistors 580 is also show in FIG. 7b.

Unlike the previously discussed metal fills, varactors actively participate in the circuit operation and carry AC currents. Their effect on the inductor is thus potentially more complicated than just extra loss due to eddy currents. For ease of simulation, the varactors may be replaced with parallel plate capacitors with similar plate resistivity as the varactor diodes while keeping the wiring the same. Simulations show that quality factor degradation is minimal when the varactors are placed under the inductor traces instead of at the center of the inductor. Not only are they exposed to a smaller magnetic field there, but they also perform the role of a PGS by further isolating the inductor from the lossy substrate. The active devices, which include a cross-coupled pair, current source, and current mirror may be replaced at the bottom center of the inductor. An EMX simulation may be run on the entire VCO structure which includes the differential inductor, the rake-shaped multi-layer metal routing, the parallel plate capacitors used to model the varactors, and the active devices. The extracted inductor S-parameters, which include all the eddy current effects, is used to evaluate the VCO in circuit simulations. Simulation results confirm that the performance of the compact VCO is close to the performance of the VCO with a plain inductor.

Figure 11:
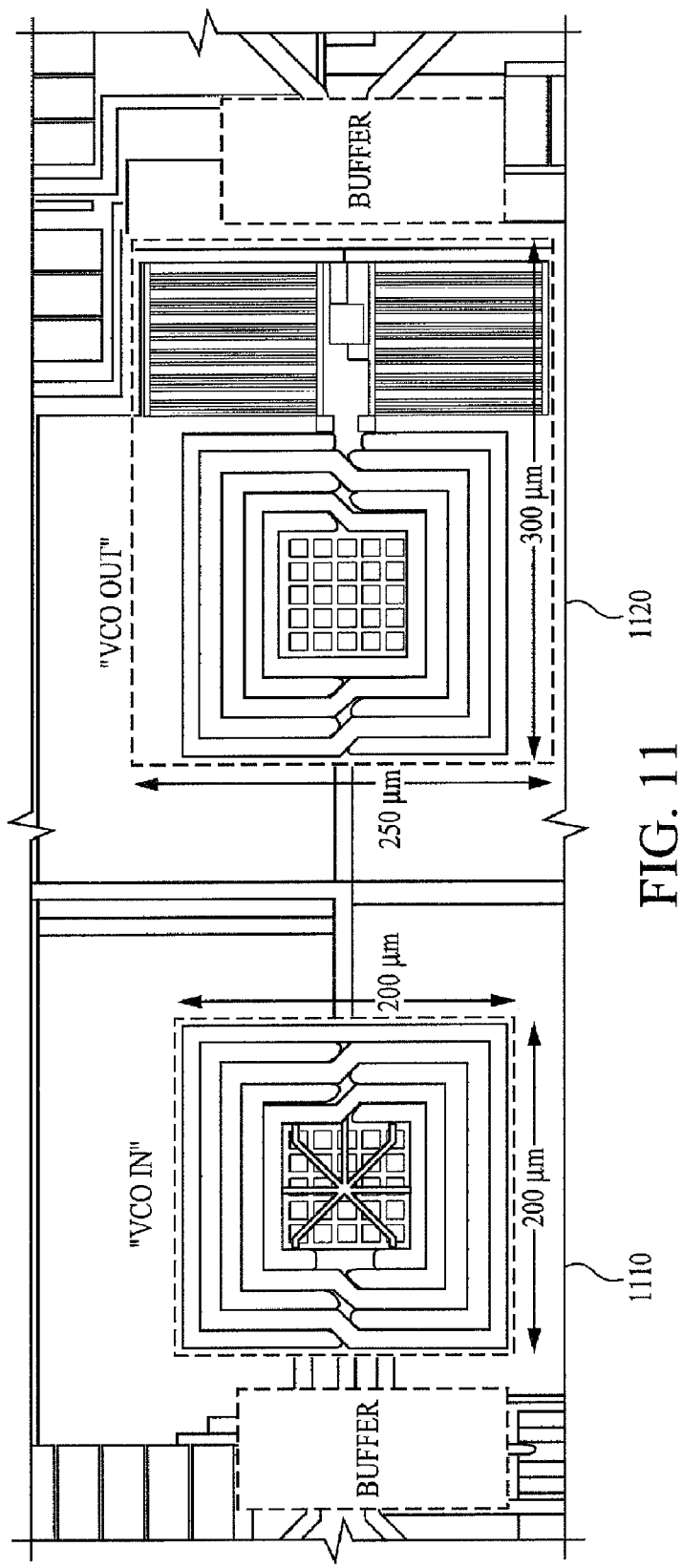
FIG. 11 is a photograph of two voltage controlled oscillators, one with varactors and active devices outside the inductor and one with varactors and active devices inside the inductor in accordance with some embodiments of the disclosed subject matter.

Benefits of embodiments of the systems and methods of the disclosed subject matter may be seen by constructing two VCOs, as discussed above, in accordance with the systems and methods of the disclosed subject matter. Referring to FIG. 11, the first is a VCO with varactors and active devices inside the inductor (hereinafter, "VCO IN") 1110. The second is a VCO with varactors and active devices outside the inductor, (hereinafter, "VCO OUT") 1120. Both VCO IN 1110 and VCO OUT 1120 may be implemented in a 0.25 µm BiCMOS process with only the peak detector implemented in bipolar transistors. Both VCOs, shown in the die photograph of FIG. 11, consume 3.2 mA from a 1.8V supply. The VCO output is connected to a buffer stage as well as a peak detector running off a 2.5V supply. Some embodiments may be implemented in any suitable transistor technology, including, for example, bipolar, CMOS, BiCMOS, and GaAs.

Figure 8A:
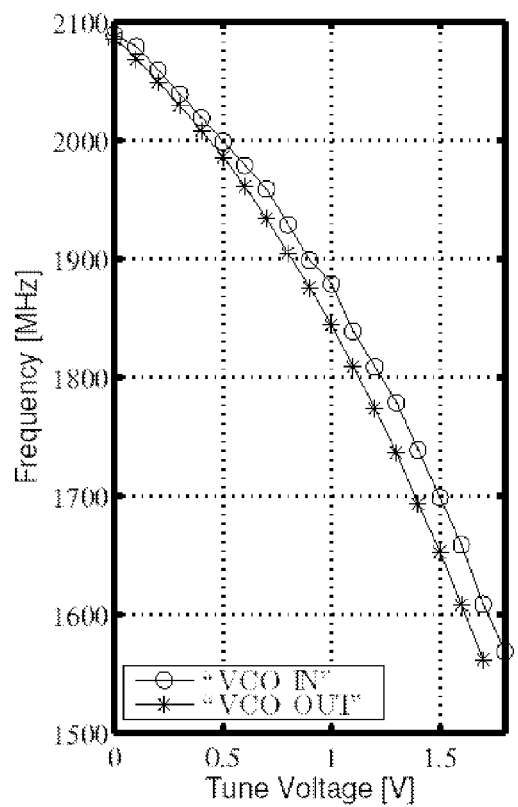
FIG. 8a is a graph illustrating the relationship between frequency and tune voltage in accordance with some embodiments of the disclosed subject matter.
Figure 8B:
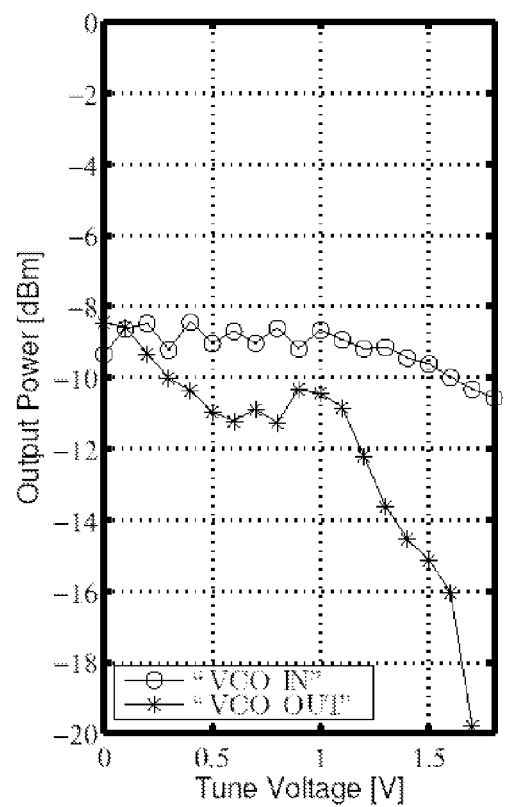
FIG. 8b is a graph illustrating the relationship between output power and tune voltage in accordance with some embodiments of the disclosed subject matter.
Figure 9A:
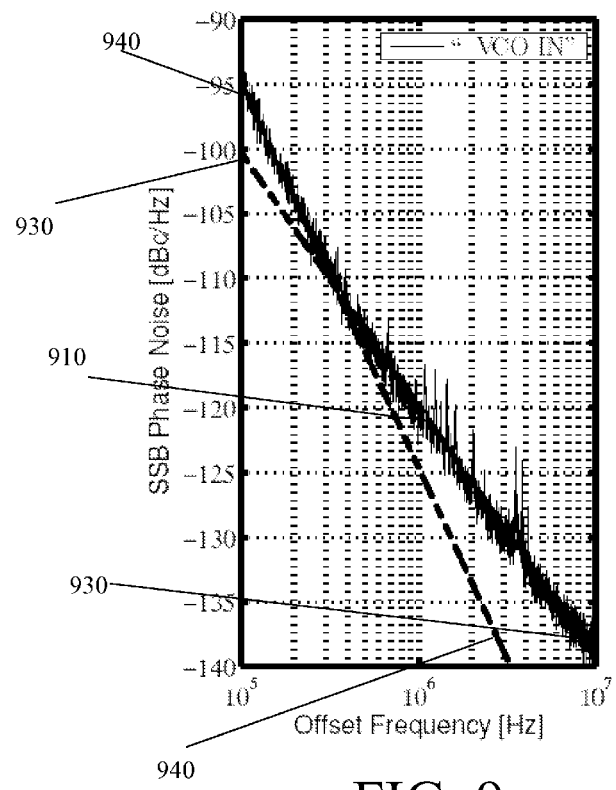
FIG. 9a is a graph illustrating the relationship between phase noise and offset frequency in accordance with some embodiments of the disclosed subject matter.
Figure 9B:
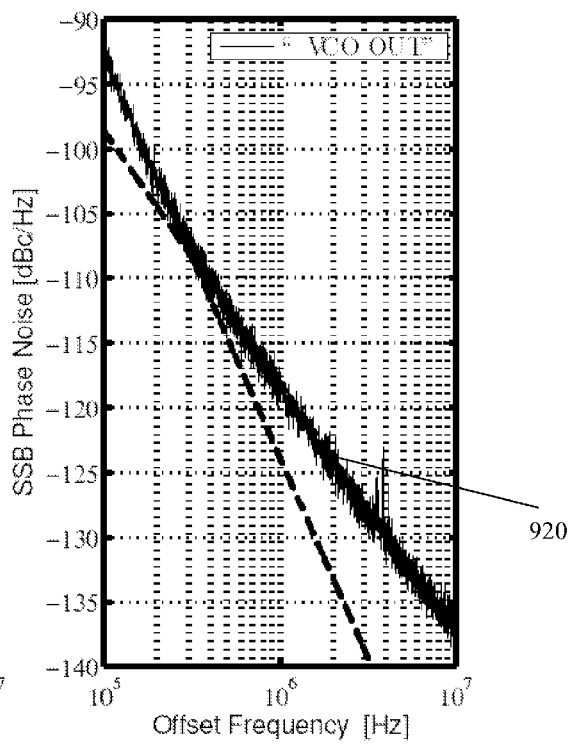
FIG. 9b is another graph illustrating the relationship between phase noise and offset frequency in accordance with some embodiments of the disclosed subject matter.
Figure 10:
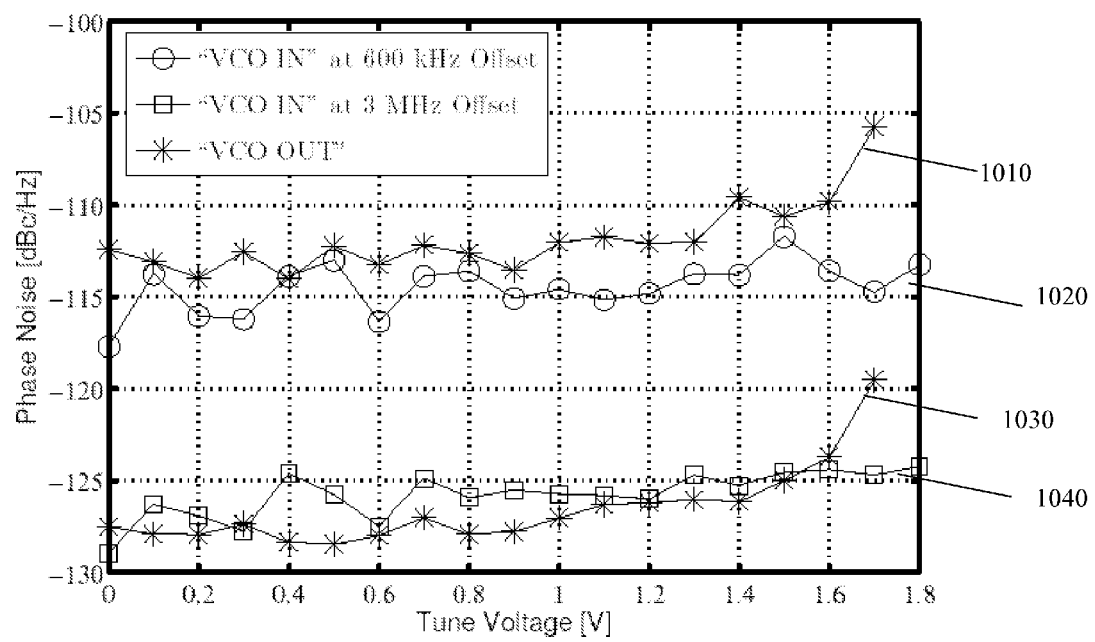
FIG. 10 is a graph illustrating the relationship between phase noise and tune voltage in accordance with some embodiments of the disclosed subject matter.

Properties of VCO IN 1110 and VCO OUT 1120 are illustrated in FIGS. 8-10. The information in these figures was generated by characterizing sets of VCO IN 1110 and VCO OUT 1120 with a Cascade RF probe station available from Cascade Microtech Inc. of Beaverton, Oreg. and an Agilent E4446A spectrum analyzer available from Agilent Technologies Inc. of Palo Alto, Calif. As shown, the measured data for VCO IN 1110 and VCO OUT 1120 was consistent despite the smaller area occupied by VCO IN 1110.

FIG. 8a illustrates the tuning characteristics of VCO IN 1110 and VCO OUT 1120. As illustrated, a wide turning range of 520 MHz, or 26% of the center frequency, was achieved. FIG. 8b illustrates the output power for different tune voltages. Both VCO IN 1110 and VCO OUT 1120 have similar output power except for at high tune voltages, which corresponds to low output frequencies.

FIG. 9 illustrates the noise spectrums of VCO IN 1110 and VCO OUT 1120 for a 2 GHz carrier frequency and a corner frequency of approximately 300 kHz, as respectively shown by lines 910 and 920. Line 930 has a slope of $1/f^2$ and line 940 has slope of $1/f^3$.

Lastly, FIG. 10 illustrates the variation in phase noise for different tuning voltages at various offset frequencies. The phase noise level at 600 kHz offset is shown for VCO IN 1110 and VCO OUT 1110 on lines 1020 and 1110 respectively. The phase noise level at 3 MHz offset is shown for VCO IN 1110 and VCO OUT 1120 on lines 1040 and 1130 respectively. As can be seen by reviewing FIGS. 8, 9, and 10, VCO IN 1110 and VCO OUT 1120 have very similar performance. The die photograph of FIG. 11 of VCO IN 1110 and VCO OUT 1120 illustrates that despite having the approximately the same performance, VCO OUT 1110 occupies 0.3×0.25 mm² while VCO IN 1120 only occupies 0.2×0.2 mm². This size difference results in an area savings of 47%. As discussed, this area savings results in lowering the cost of manufacturing circuits.

Although the invention has been described and illustrated in the foregoing illustrative embodiments, it is understood that the present disclosure has been made only by way of example, and that numerous changes in the details of implementation of the invention can be made without departing from the spirit and scope of the invention. For example, although one example used was placing a VCO inside an inductor, the invention is not limited in this manner. Rather, according to various embodiments of the present invention, a phase locked loop filter or any other suitable circuit or combination of circuits may be placed under the VCO inductor.

Therefore, other embodiments, extensions, and modifications of the ideas presented above are comprehended and should be within the reach of one versed in the art upon reviewing the present disclosure. Accordingly, the scope of the present invention in its various aspects should not be limited by the examples presented above. The individual aspects of the present invention, and the entirety of the invention should be regarded so as to allow for such design modifications and future developments within the scope of the present disclosure. The present invention is limited only by the claims that follow.

What is claimed is:

1. An electronic device comprising:
  an on-chip inductor formed from an inductor path having two ends that loops around a center area, wherein the inductor path is formed in an integrated circuit having a plurality of layers, the inductor path crosses itself at least two points, and the inductor path defines an outer boundary of the inductor with respect to the cross section of the plurality of layers of the integrated circuit and an inner boundary of the inductor with respect to the cross section of the plurality the plurality of layers of the integrated circuit that is outside the center area; and
  a circuit comprising:
    a first device and a second device, wherein the first device and the second device are at least partially located between the outer boundary of the inductor and the inner boundary of the inductor, each have a first terminal and a second terminal, are coupled together by a first connector path that passes through the center area between the first terminal of the first device and the first terminal of the second device, and are each connected to the inner-most turn of the inductor path by the second terminal of the device; and
    a third device and a fourth device, wherein the third device and the fourth device are at least partially located between the outer boundary of the inductor and the inner boundary of the inductor, each have a first terminal and a second terminal, are coupled together by a second connector path that passes through the center area between the first terminal of third device and the first terminal of the fourth device, and are each connected to the inner-most turn of the inductor path by the second terminal of the device,
    wherein the first device, the second device, the third device, and the fourth device are each connected to the inner-most turn of the inductor path at a different location, and
    wherein the first connector path is connected to the second connector path.

2. The device of claim 1, wherein the first connector path is formed in at least one of the plurality of layers above or below the inductor path and the first connector path crosses above or below the inductor path at a perpendicular angle to the inductor path.

3. The device of claim 2, wherein the shape of the first connector path is that of a patterned ground shield.

4. The device of claim 1, wherein the inductor and circuit form part of a voltage controlled oscillator.

5. The device of claim 1, wherein the inductor at least approximates a circular shape.

6. The device of claim 1, wherein the inductor at least approximates a rectangular shape.

7. The device of claim 1, wherein the inductor at least approximates a square shape.

8. The device of claim 1, wherein the inductor at least approximates a octagonal shape.

9. The device of claim 1, wherein the connector path is formed from at least two of the plurality of layers that are strapped together.

10. The device of claim 1, wherein each of the two devices is a varactor, and the first terminal of each device is an anode and the second terminal of each devices is a cathode.

* * * * *

UNITED STATES PATENT AND TRADEMARK OFFICE
CERTIFICATE OF CORRECTION

| | | |
|---|---|---|
| PATENT NO. | : 7,847,667 B2 | Page 1 of 1 |
| APPLICATION NO. | : 11/943287 | |
| DATED | : December 7, 2010 | |
| INVENTOR(S) | : Kinget et al. | |

It is certified that error appears in the above-identified patent and that said Letters Patent is hereby corrected as shown below:

Title page, ABSTRACT, line 5: "itself at least two points" should be --itself at at least two points--.
Specification, column 2, line 23: "itself at least two points" should be --itself at at least two points--.
Claim 1, line 5: "itself at least two points" should be --itself at at least two points--.

Signed and Sealed this
Twelfth Day of July, 2011

David J. Kappos
*Director of the United States Patent and Trademark Office*

UNITED STATES PATENT AND TRADEMARK OFFICE
CERTIFICATE OF CORRECTION

PATENT NO. : 7,847,667 B2  Page 1 of 1
APPLICATION NO. : 11/943287
DATED : December 7, 2010
INVENTOR(S) : Kinget et al.

It is certified that error appears in the above-identified patent and that said Letters Patent is hereby corrected as shown below:

Title page, ABSTRACT, line 5: "itself at least two points" should be --itself at at least two points--.
Specification, column 2, line 23: "itself at least two points" should be --itself at at least two points--.
Column 8, lines 24-25 (Claim 1, lines 5-6) "itself at least two points" should be --itself at at least two points--.

This certificate supersedes the Certificate of Correction issued July 12, 2011.

Signed and Sealed this
Sixteenth Day of August, 2011

David J. Kappos
*Director of the United States Patent and Trademark Office*